United States Patent
Otake et al.

(10) Patent No.: US 8,243,176 B2
(45) Date of Patent: Aug. 14, 2012

(54) SOLID-STATE IMAGE SENSOR

(75) Inventors: Yusuke Otake, Toyama (JP);
Mitsuyoshi Mori, Kyoto (JP); Shinzou Kouyama, Osaka (JP); Toru Okino, Osaka (JP)

(73) Assignee: Panasonic Corporation, Osaka (JP)

( * ) Notice: Subject to any disclaimer, the term of this patent is extended or adjusted under 35 U.S.C. 154(b) by 337 days.

(21) Appl. No.: 12/602,747

(22) PCT Filed: Jun. 2, 2009

(86) PCT No.: PCT/JP2009/002466
§ 371 (c)(1),
(2), (4) Date: Dec. 2, 2009

(87) PCT Pub. No.: WO2010/004683
PCT Pub. Date: Jan. 14, 2010

(65) Prior Publication Data
US 2010/0220228 A1 Sep. 2, 2010

(30) Foreign Application Priority Data
Jul. 11, 2008 (JP) ................................. 2008-181537

(51) Int. Cl.
*H04N 3/14* (2006.01)
*H04N 5/335* (2011.01)

(52) U.S. Cl. ........ 348/294; 348/298; 348/302; 348/312; 348/272; 348/273

(58) Field of Classification Search .................. 348/294, 348/298, 302, 312, 272, 273; 250/208.1; 257/290–292
See application file for complete search history.

(56) References Cited

U.S. PATENT DOCUMENTS

| 7,208,811 | B2 | 4/2007 | Tamai |
| 7,821,552 | B2 * | 10/2010 | Suzuki .......................... 348/272 |
| 2001/0006237 | A1 * | 7/2001 | Abe .............................. 257/215 |
| 2002/0140009 | A1 | 10/2002 | Lee et al. |
| 2003/0169359 | A1 | 9/2003 | Merrill et al. |
| 2003/0189656 | A1 | 10/2003 | Shinohara |
| 2004/0178478 | A1 | 9/2004 | Shizukuishi |
| 2006/0163618 | A1 | 7/2006 | Park |
| 2006/0181623 | A1 | 8/2006 | Endo et al. |
| 2006/0214249 | A1 | 9/2006 | Nam et al. |
| 2007/0146512 | A1 | 6/2007 | Suzuki et al. |

(Continued)

FOREIGN PATENT DOCUMENTS

JP 06-204444 7/1994
(Continued)

*Primary Examiner* — Yogesh Aggarwal
(74) *Attorney, Agent, or Firm* — McDermott Will & Emery LLP

(57) ABSTRACT

A solid-state image sensor includes: a semiconductor substrate 22; a plurality of pixels 23 arranged on the semiconductor substrate 22 and respectively including photoelectric conversion regions 24; and an isolation region 25 electrically isolating the pixels 23 from one another. The first pixel 31 includes a first photoelectric conversion region 32 and a first color filter 41 having a peak of its optical transmission in a first wavelength range. The second pixel 34 adjacent to the first pixel 31 includes a second photoelectric conversion region 35 and a second color filter 42 having peaks in its optical transmission in the first wavelength range and a second wavelength range including shorter wavelengths than the first wavelength range. A portion 33 of a deep portion of the first photoelectric conversion region 32 extends across the isolation region 25 to reach a portion under the second photoelectric conversion region 35.

8 Claims, 7 Drawing Sheets

U.S. PATENT DOCUMENTS

2008/0061329 A1    3/2008  Park
2008/0157139 A1*   7/2008  Lee ............................... 257/292

FOREIGN PATENT DOCUMENTS

| | | |
|---|---|---|
| JP | 2001-185711 | 7/2001 |
| JP | 2002-016243 | 1/2002 |
| JP | 2002-142228 | 5/2002 |
| JP | 2003-298038 | 10/2003 |
| JP | 2004-273952 | 9/2004 |
| JP | 2004-281773 | 10/2004 |
| JP | 2006-165362 | 6/2006 |
| JP | 2007-066962 | 3/2007 |
| JP | 2007-202107 | 8/2007 |
| JP | 2008-066732 | 3/2008 |
| JP | 2008-147471 | 6/2008 |
| JP | 2008-258430 | 10/2008 |

* cited by examiner

SOLID-STATE IMAGE SENSOR

RELATED APPLICATIONS

This application is the U.S. National Phase under 35 U.S.C. §371 of International Application No. PCT/JP2009/002466, filed on Jun. 2, 2009, which in turn claims the benefit of Japanese Application No. 2008-181537, filed on Jul. 11, 2008, the disclosures of which Applications are incorporated by reference herein.

TECHNICAL FIELD

The present disclosure relates to solid-state image sensors such as CCD image sensors and MOS image sensors, and more particularly to a solid-state image sensor in which the efficiency in using incident light with a long wavelength is increased to achieve high sensitivity.

BACKGROUND ART

Solid-state image sensors such as CCD image sensors and MOS image sensors are widely used as devices for obtaining video information on subjects in video cameras, digital cameras, and the like. A solid-state image sensor includes a pixel section in which a plurality of pixels with photoelectric conversion regions are arranged in a two-dimensional array. The photoelectric conversion region in each of the pixels performs photoelectric conversion on light incident on the pixel from a subject, and accumulates signal charge generated by the photoelectric conversion. This signal charge is output from a signal readout circuit, thereby obtaining video information.

The pixel size of solid-state image sensors has been reduced in recent years, resulting in higher resolution. The reduction in pixel size, however, reduces the ratio of the light-receiving area per a unit pixel area (i.e., fill factor), and also reduces the area of photoelectric conversion regions. Consequently, the sensitivity of the solid-state image sensors decreases. Since the light-focusing ability of a microlens to long-wavelength light is lower than that to short-wavelength light, the reduction of the fill factor reduces the sensitivity especially to long-wavelength light. In addition, as the light wavelength increases, the light absorption efficiency in a semiconductor substrate decreases, and thus the sensitivity of the solid-state image sensor to long-wavelength light decreases. Enhancement of the sensitivity to infrared light having a long wavelength is essential for solid-state image sensors capable of capturing infrared light for use in vehicle onboard systems, security systems, and the like.

In view of this, Patent Document 1 describes a solid-state image sensor in which a plurality of photoelectric conversion regions are provided at different depths in a substrate within a single pixel in order to enhance the efficiency in using incident light and, thereby, increase the sensitivity of the solid-state image sensor.

Patent Document 2 describes a solid-state image sensor in which a lower region of a photoelectric conversion region is extended in an in-plane direction (i.e., in the direction parallel to a semiconductor substrate surface) of a semiconductor substrate in order to increase the sensitivity of the solid-state image sensor. Specifically, the extension of the photoelectric conversion region means an increase in the area of a charge collection region, and allows photoelectric conversion to be performed on an oblique component of incident long-wavelength light which was not conventionally absorbed in a photoelectric conversion region and was transmitted to a deep portion of the semiconductor substrate, resulting in an increase in the sensitivity.

Patent Document 3 describes an example of a solid-state image sensor capable of capturing visible light and infrared light at the same time. In this document, four types of color filters are regularly arranged on pixels, and difference operation is performed on outputs from the respective pixels so as to allow a single solid-state image sensor to capture both visible light and infrared light.

Citation List

Patent Document

PATENT DOCUMENT 1: Japanese Patent Publication No. 2007-66962

PATENT DOCUMENT 2: Japanese Patent Publication No. 2001-185711

PATENT DOCUMENT 3: Japanese Patent Publication No. 2002-142228

SUMMARY OF THE INVENTION

Technical Problem

In the solid-state image sensor disclosed in Patent Document 1 described above, a plurality of photoelectric conversion regions are provided in a single pixel. Accordingly, signal readout circuits need to be respectively provided to the photoelectric conversion regions, and thus the sensitivity decreases as the fill factor of the pixels decreases. Since the fill factor spontaneously decreases with a decrease in the pixel size, a further decrease in the fill factor caused by addition of signal readout circuits makes it difficult to increase the sensitivity of the solid-state image sensor, especially the sensitivity to long-wavelength light.

In the solid-state image sensor disclosed in Patent Document 2 described above, the photoelectric conversion region extends under a light-shielding layer. Thus, this extension portion of the photoelectric conversion region can use only an oblique component of incident light. When the pixel size is further reduced, the extendable area of the photoelectric conversion region decreases, thereby making it difficult to greatly increase the sensitivity.

In the solid-state image sensor disclosed in Patent Document 3 described above, four types of color filters provided in pixels separate visible light and infrared light from each other, thereby capturing both infrared light and visible light with the photoelectric conversion regions having the same configuration. Accordingly, the sensitivity especially to infrared light having long wavelengths is lower than that to visible light. In addition, in capturing visible light, signal processing is performed by subtracting an infrared light signal component from an output signal from a pixel for capturing visible light. However, in obtaining the difference between both signals, the noise component increases, resulting in a decrease in the SN ratio after the signal processing.

It is therefore an object of the present invention to provide a solid-state image sensor capable of increasing the sensitivity to long-wavelength light, such as infrared light, and increasing the SN ratio of an obtained image.

Solution to the Problem

To solve the foregoing technical problems, a solid-state image sensor according to the present invention includes: a semiconductor substrate; a plurality of pixels arranged on the semiconductor substrate and respectively including photoelectric conversion regions: and an isolation region electrically isolating the pixels from one another. A first pixel of the pixels includes a first photoelectric conversion region and a first color filter having a peak of its optical transmission in a first wavelength range. A second pixel of the pixels adjacent to the first pixel includes a second photoelectric conversion region and a second color filter having peaks in its optical transmission in the first wavelength range and a second wavelength range including shorter wavelengths than the first wavelength range. A deep portion of the first photoelectric conversion region partially extends across the isolation region to reach a portion under the second photoelectric conversion region.

Advantages of the Invention

In a solid-state image sensor according to the present invention, a deep portion of the first photoelectric conversion region located in the first pixel has a projection which extends to a portion under the second photoelectric conversion region. Accordingly, a charge collection region with respect to long-wavelength light (i.e., light in the first wavelength range) is larger than that in a conventional solid-state image sensor, thereby increasing the sensitivity to long-wavelength light.

In addition, since long-wavelength light reaches a deeper portion of the semiconductor layer than short-wavelength light (i.e., light in the second wavelength range), short-wavelength light (e.g., visible light) and long-wavelength light (e.g., infrared light) are substantially isolated from each other in the second pixel by the second photoelectric conversion region and the projection of the first photoelectric conversion region. Consequently, a long-wavelength light signal component (e.g., an infrared light signal component) subjected to photoelectric conversion in the second photoelectric conversion region decreases, whereas a long-wavelength light signal component subjected to photoelectric conversion in the first photoelectric conversion region increases. Accordingly, in a solid-state image sensor in which a short-wavelength light signal component (e.g., a visible light signal component) is obtained by subtracting an output signal (e.g., a large infrared light signal component) from the first photoelectric conversion region from an output signal (e.g., a visible light signal component+a small infrared light signal component) from the second photoelectric conversion region, the coefficient (K) of the difference decreases, and thereby, noise occurring in the difference operation is reduced, resulting in suppression of a decrease in the SN ratio.

DESCRIPTION OF EMBODIMENTS

Embodiments of the present invention will be described hereinafter with reference to the drawings.

Embodiment 1

Figure 1:
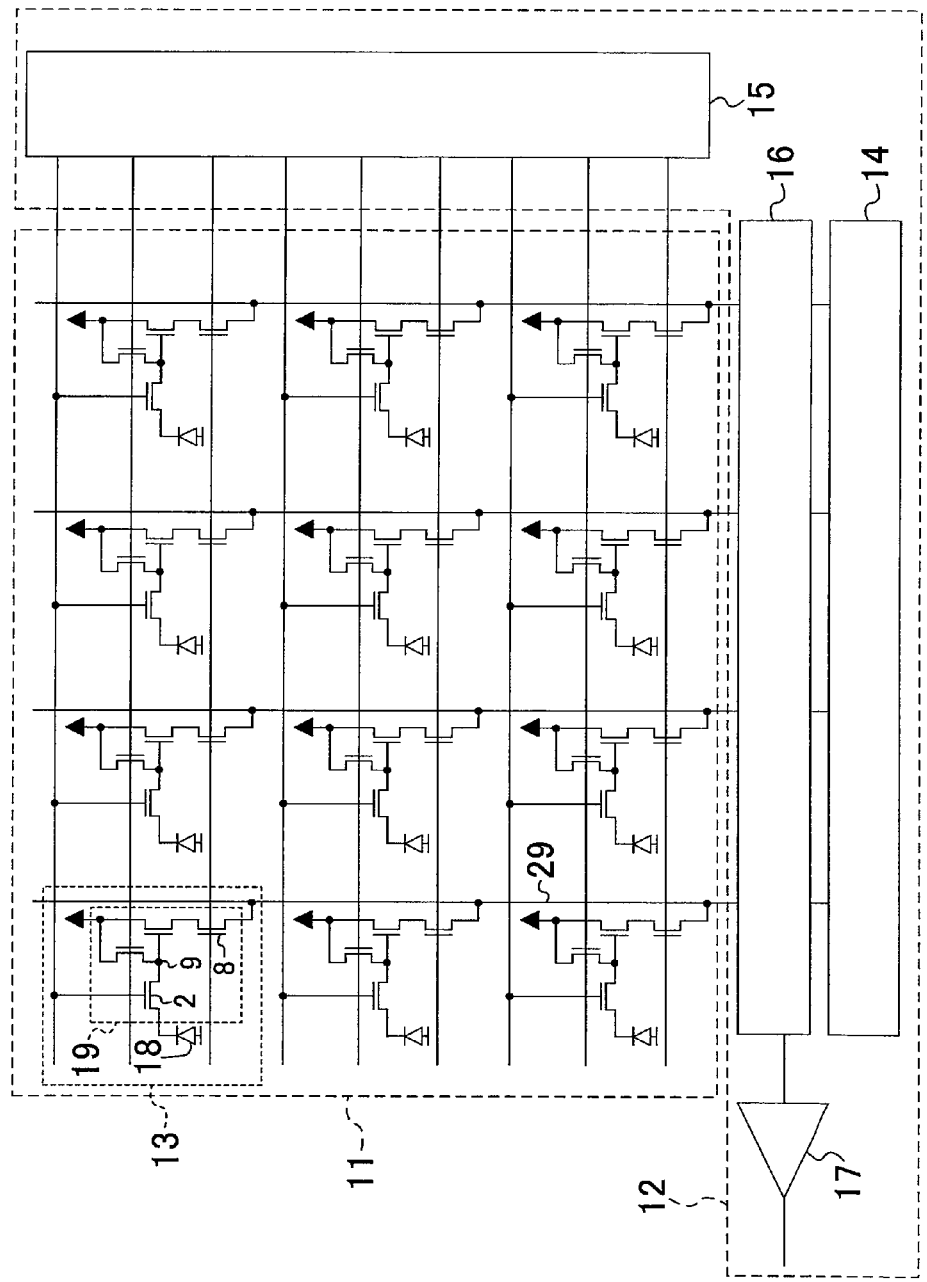
FIG. 1 is a view schematically illustrating a circuit configuration of a solid-state image sensor according to a first embodiment of the present invention.

FIG. 1 is a view schematically illustrating a circuit configuration of a solid-state image sensor according to a first embodiment of the present invention. In this embodiment, a MOS image sensor is described as an example of a solid-state image sensor. However, the present invention is not limited to MOS image sensors, and is applicable to solid-state image sensors such as CCD image sensors.

As illustrated in FIG. 1, the solid-state image sensor of this embodiment includes: a pixel section 11 in which a plurality of pixels 13 are arranged; and a peripheral circuit 12 extending along a side of the pixel section 11. The pixels 13 are arranged in a two-dimensional array. Alternatively, the pixels 13 may be arranged in a different pattern.

Each of the pixels 13 includes: a photoelectric conversion region 18 such as a photodiode; and a signal-readout circuit 19 configured to read signals accumulated in the photoelectric conversion region 18 to a signal line 29. The signal-readout circuit 19 includes: a transfer transistor 2 for transferring charge accumulated in, for example, the photoelectric conversion region 18 to a floating diffusion 9; an amplifying transistor 6 configured to convert signal charge into a voltage and to amplify the voltage; a reset transistor 4 for resetting the state of the floating diffusion 9; and a select transistor 8 configured to select a pixel from which a signal is to be read out. Part of the signal-readout circuit 19 (e.g., the select transistor 8) is shared by a plurality of pixels 13 in some cases.

The peripheral circuit 12 includes: a horizontal shift register 14 connected to the signal lines 29 associated with respective columns; and a vertical shift register 15 configured to control the transfer transistors 2; a correlated double sampling (CDS) circuit 16; and an amplifier 17 configured to amplify signals read out from the pixels 13.

Charge generated by photoelectric conversion in the photoelectric conversion region 18 is temporally accumulated in the photoelectric conversion region 18 as described above. One of the pixels 13 in which the charge is accumulated is selected with an XY address method using the horizontal shift register 14 and the vertical shift register 15. The signal-readout circuit 19 reads an optical signal as an electrical signal from the selected pixel 13. The electrical signal read out to the signal line 29 is subjected to noise reduction in the CDS circuit 16, and then is output as a video signal from the amplifier 17.

Figure 2:
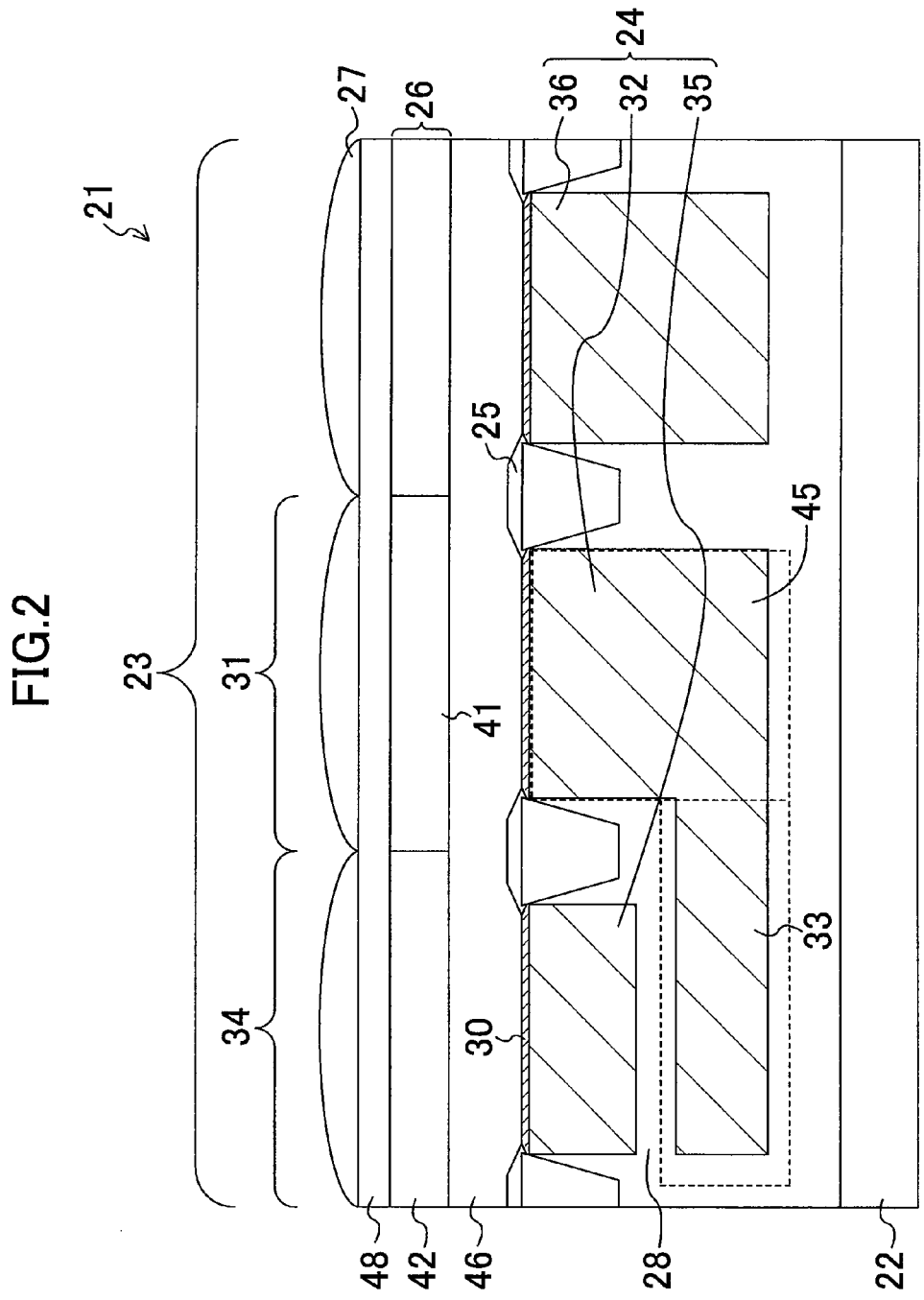
FIG. 2 is a cross-sectional view schematically illustrating a pixel section of the solid-state image sensor of the first embodiment.

FIG. 2 is a cross-sectional view schematically illustrating the pixel section of the solid-state image sensor of the first embodiment. As illustrated in FIG. 2, the solid-state image sensor 21 of this embodiment includes: a plurality of pixels 23 arranged on a semiconductor substrate 22; and an isolation region 25 provided above the semiconductor substrate 22 and electrically isolating the pixels 23 from one another.

The pixels 23 include: a semiconductor layer 28 of a first conductivity type provided on the semiconductor substrate 22; a plurality of photoelectric conversion regions 24 of a second conductivity type provided in the semiconductor layer 28; a diffusion layer 30 of the first conductivity type provided on the photoelectric conversion regions 24; a first planarized film 46 provided over the diffusion layer 30 and the isolation region 25; a plurality of color filters 26 provided above the diffusion layer 30 (i.e., on the first planarized film 46) and associated with the respective pixels 23; a second planarized film 48 provided on the color filters 26; and a plurality of microlenses 27 provided on the second planarized film 48. The semiconductor layer 28 and each of the photoelectric conversion regions 24 form a PN junction. The diffusion layer 30 and each of the photoelectric conversion regions 24 form a PN junction.

In the example illustrated in FIG. 2, the pixels 23 include a first pixel 31 and a second pixel 34. The color filters 26 include a first color filter 41 and a second color filter 42. The photoelectric conversion regions 24 include a first photoelectric conversion region 32, a second photoelectric conversion region 35, and a third photoelectric conversion region 36. In the first pixel 31, the first photoelectric conversion region 32 and the first color filter 41 are provided. In the second pixel 34, the second photoelectric conversion region 35 and the second color filter 42 are provided. The first color filter 41 has spectral characteristics having a peak of its transmission in a first wavelength range. The second color filter 42 has spectral characteristics having peaks of its transmission in the first wavelength range and a second wavelength range including shorter wavelengths than the first wavelength range.

In the solid-state image sensor of this embodiment, a portion (i.e., a projection 33) of a deep portion of the first photoelectric conversion region 32 located in the first pixel 31 extends across the isolation region 25 to reach a portion under the second photoelectric conversion region 35 in the second pixel 34 adjacent to the first pixel 31. The first photoelectric conversion region 32 and the second photoelectric conversion region 35 are electrically isolated from each other by the semiconductor layer 28 of the first conductivity type. The impurity concentration in the first photoelectric conversion region 32 is preferably lower than that in a portion 45 of the first photoelectric conversion region 32 located in the first pixel 31 because of the reasons described below. The projection 33 may extend to a portion under the signal-readout circuit within the same pixel. This configuration can increase the amount of light obliquely incident on the first pixel 31.

FIG. 2 illustrates an example in which the projection 33 is located under the second photoelectric conversion region 35. Alternatively, in a configuration in which the pixels 23 are arranged in a two-dimensional array, it is sufficient that the projection 33 is adjacent to the first pixel 31 and is located in at least one of eight pixels surrounding the first pixel 31. The projection 33 does not need to be provided under the entire second photoelectric conversion region 35, and may overlap with at least part of the second photoelectric conversion region 35 in plan view. If the projection 33 extends to adjacent pixels, the pixels in which the projection 33 is located are provided with color filters which pass not only light in wavelength ranges associated with these pixels but also light in the first wavelength range.

Figure 3:
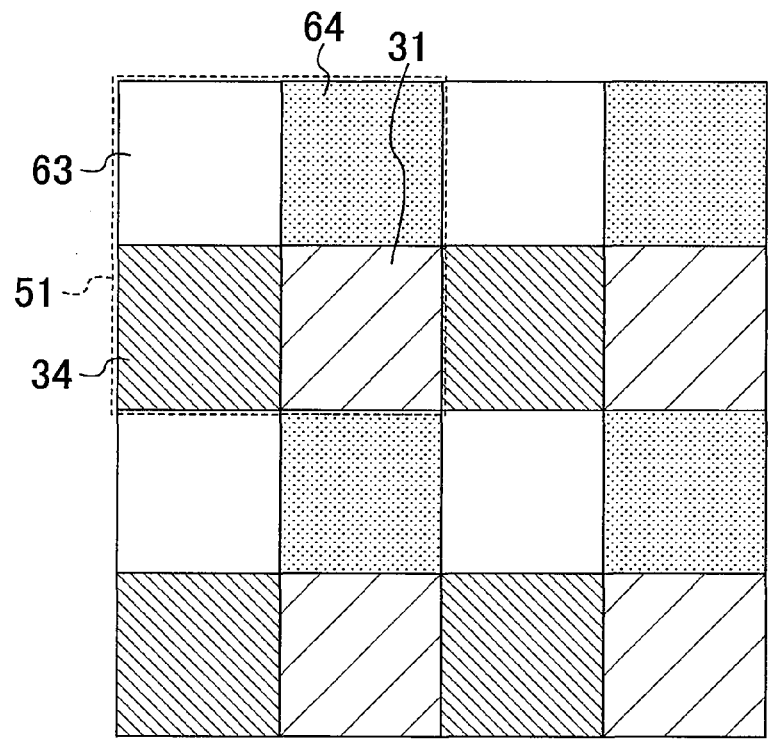
FIG. 3 is a plan view schematically illustrating the pixel section of the solid-state image sensor of the first embodiment.

FIG. 3 is a plan view schematically illustrating the pixel section of the solid-state image sensor of the first embodiment. Each block in FIG. 3 schematically expresses a pixel.

As illustrated in FIG. 3, in the pixel section of the solid-state image sensor of this embodiment, groups of pixels 51 are regularly arranged in a two-dimensional array. Each of the groups of pixels 51 contains at least one first pixel 31 and at least one second pixel 34. In this embodiment, the pixel pattern is a two-dimensional array, but may be a different pattern such as a honeycomb pattern.

Figure 4:
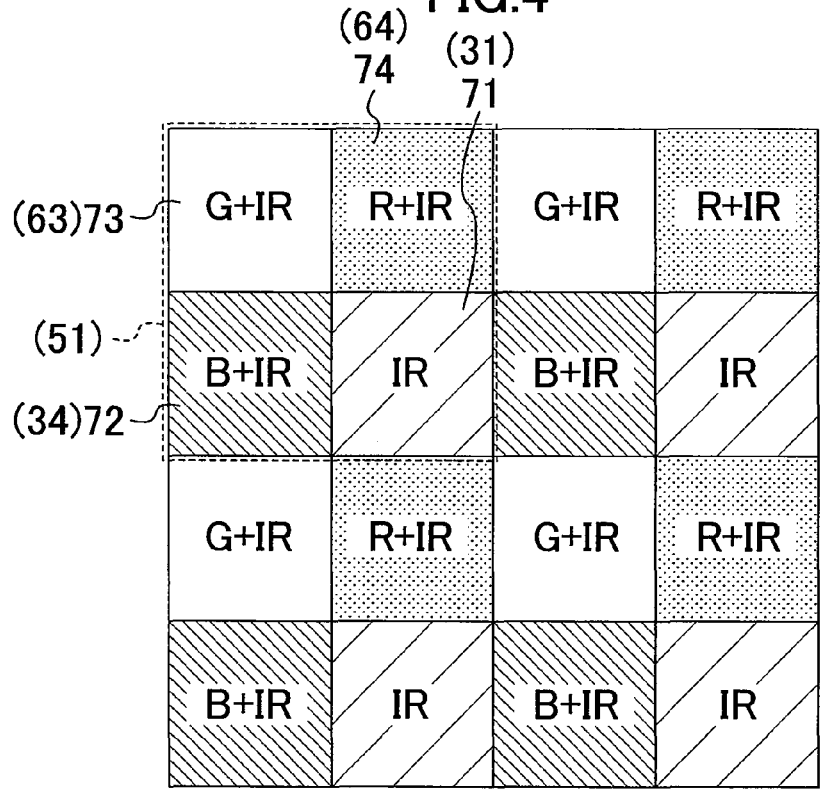
FIG. 4 is a view illustrating an example of a color filter array in the pixel section of the solid-state image sensor of the first embodiment.

FIG. 4 is a view illustrating an example of a color filter array in the pixel section of the solid-state image sensor of this embodiment. In FIG. 4, the pixels are arranged in the same manner as in the example of FIG. 3.

In the solid-state image sensor of this embodiment, color filters having different spectral characteristics may be respectively provided in four pixels constituting one group of pixels 51. Specifically, as illustrated in FIG. 4, the first pixel 31 may be provided with a color filter 71 (shown as "IR" in the drawing) which passes only infrared light, the second pixel 34 may be provided with a color filter 72 (shown as "B+IR" in the drawing) which passes light in a blue region (i.e., blue light) and infrared light, a pixel 63 may be provided with a color filter 73 (shown as "G+IR" in the drawing) which passes light in a green region (i.e., green light) and infrared light, and a pixel 64 may be provided with a color filter 74 (shown as "R+IR" in the drawing) which passes light in a red region (i.e., red light) and infrared light.

In this case, only infrared light is selected from light incident on the first pixel 31 through the color filter 71, and is subjected to photoelectric conversion in the portion 45 of the first photoelectric conversion region 32 provided in the first pixel 31. The generated signal charge is accumulated in the first photoelectric conversion region 32.

Blue light and infrared light are selected from light incident on the second pixel 34 through the color filter 72. Since short-wavelength light such as blue light has a larger absorption coefficient in a semiconductor material such as silicon than long-wavelength light, the short-wavelength light is absorbed in a portion near the upper surface of the substrate (i.e., a semiconductor portion including the photoelectric conversion regions 24, the semiconductor layer 28, and the diffusion layer 30). Accordingly, the blue light is subjected to photoelectric conversion in the second photoelectric conversion region 35, and the generated signal charge is accumulated in the second photoelectric conversion region 35. On the other hand, since long-wavelength light such as infrared light reaches a deep portion of the substrate, infrared light incident on the second pixel 34 is subjected to photoelectric conversion in the second photoelectric conversion region 35 and the projection 33 of the first photoelectric conversion region 32 located under the second photoelectric conversion region 35. The generated signal charge is accumulated in the second photoelectric conversion region 35 and the first photoelectric conversion region 32. Since the semiconductor layer 28 of the first conductivity type is provided between the first photoelectric conversion region 32 and the second photoelectric conversion region 35, charge generated in these photoelectric conversion regions is not mixed together. The impurity concentration in the projection 33 of the first photoelectric conversion region 32 is preferably lower than that in the portion 45 of the first photoelectric conversion region 32 located in the first pixel 31. In this case, a potential gradient occurs in the first photoelectric conversion region 32, resulting in that signal charge generated in the projection 33 is easily read out.

The first photoelectric conversion region 32 for capturing infrared light is located in a deeper portion in the semiconductor layer 28 than the second photoelectric conversion region 35 for receiving short-wavelength blue light. This configuration allows more effective photoelectric conversion to be performed on infrared light which is more poorly absorbed than visible light.

Green light and infrared light are selected from light incident on the pixel 63 through the color filter 73. Red light and infrared light are selected from light incident on the pixel 64 through the color filter 74. The selected light in the pixels is subjected to photoelectric conversion in the photoelectric conversion regions. The generated signal charge is accumulated in the photoelectric conversion regions.

In the color filters of the example illustrated in FIG. 4, infrared light is used as light in the first wavelength range, and blue light is used as light in the second wavelength range. However, the second wavelength range only needs to include shorter wavelengths than the first wavelength range. Specifically, if the first wavelength range is an infrared region, the second wavelength range may be a blue region, a green region, or a red region, for example. If the first wavelength range is a red region, the second wavelength range may be a blue region or a green region, for example. The projection 33 of the first photoelectric conversion region 32 may extend to portions in multiple ones of three pixels except for the first pixel 31 out of a group of pixels 51.

In the solid-state image sensor of this embodiment, the depth of a portion of the first photoelectric conversion region 32 provided in the first pixel 31 is greater than the second photoelectric conversion region 35 for performing photoelectric conversion on short-wavelength light. Accordingly, photoelectric conversion can be effectively performed on incident long-wavelength light (e.g., infrared light). In addition, the projection 33 of the first photoelectric conversion region 32 allows photoelectric conversion to be performed on long-wavelength light incident on the second pixel 34 adjacent to the first pixel 31. Accordingly, the sensitivity to long-wavelength light is much higher than that in a conventional solid-state image sensor, as compared to a configuration where the photoelectric conversion regions are provided only in one pixel. For this reason, a decrease in sensitivity to long-wavelength light can be suppressed even with a reduction in the pixel size. If the projection 33 extends to a portion under the signal-readout circuit formed in the first pixel 31, photoelectric conversion is performed in a larger area, thereby further increasing the sensitivity to long-wavelength light.

Figure 5:
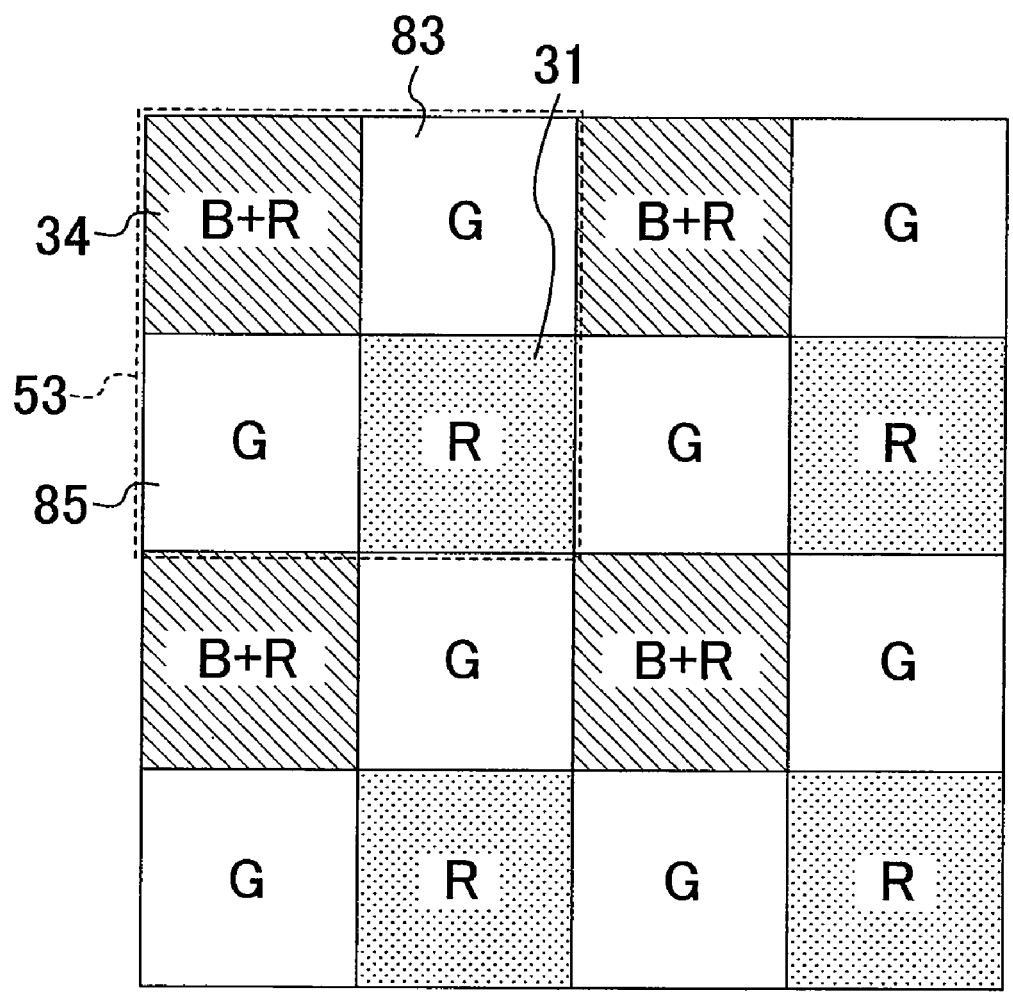
FIG. 5 is a view schematically illustrating the pixel section in a case where the color filter array has a Bayer pattern in the solid-state image sensor of the first embodiment.

In the configuration of the pixel section described above is also useful for color filters having a Bayer pattern. FIG. 5 is a view schematically illustrating the pixel section in a case where the color filter array has a Bayer pattern in the solid-state image sensor of this embodiment. In the example illustrated in FIG. 5, the first pixel 31 is provided with a color filter which passes red light. The second pixel 34 located diagonally upward to the left of, and adjacent to, the first pixel 31 is provided with a color filter which passes blue light and red light. Pixels 83 and 85 constituting a group of pixels 53 together with the first pixel 31 and the second pixel 34 are respectively provided with color filters which pass green light. In the pixel section, groups of pixels 53 are arranged in a matrix pattern. The projection 33 of the first photoelectric conversion region 32 in the first pixel 31 extends to a portion under the second photoelectric conversion region 35 in the second pixel 34. Specifically, in FIG. 5, the projection 33 of the first photoelectric conversion region 32 diagonally extends in a plane in which pixels are arranged.

In this manner, in a configuration where a red region is used as the first wavelength range and a blue region is used as the second wavelength range, the projection 33 of the first photoelectric conversion region 32 can also perform photoelectric conversion on red light incident on the second pixel 34, thereby making it possible to greatly increase the sensitivity to red light.

If a pixel pattern, e.g., a honeycomb pattern, different from the Bayer pattern described above is employed, the distance between the barycenter of the first pixel 31 provided with the color filter passing red light and the barycenter of the second pixel 34 provided with the color filter passing blue light and red light can be shorter than that in the case of the Bayer pattern. Accordingly, the length of the projection 33 of the first photoelectric conversion region 32 can be reduced, thereby allowing charge subjected to photoelectric conversion in the projection 33 to be more easily read out. In a case where the color filter array illustrated in FIG. 4 has a pixel pattern in which the distance between the barycenters of the diagonally disposed first and second pixels 31 and 34 is short, similar advantages can also be obtained.

In addition, the solid-state image sensor of this embodiment is also useful when being applied as a solid-state image sensor capable of capturing visible light and infrared light at the same time. The color filter pattern in the pixel section of the solid-state image sensor in this case is the same as that shown in FIG. 4, for example. To obtain an image from visible light, it is necessary to calculate a signal generated from a visible light component of incident light by subtracting a signal component of infrared light from an output signal from a pixel for capturing visible light. In this case, the visible light signal component V is expressed as:

$$V = (V + IR_{VIS}) - K \cdot IR_{IR} \quad (1)$$

where V is a visible light signal component of an output signal from a pixel for capturing visible light, $IR_{VIS}$ is an infrared light signal component of an output signal from a pixel for capturing visible light, and $IR_{IR}$ is an infrared light signal component output from a pixel for capturing infrared light. In Equation (1), K is a coefficient for accurately removing an infrared light signal component. On the other hand, a noise component $N_{VIS}$ from a pixel for capturing visible light can be approximated to photon shot noise in the presence of a sufficient amount of light in the daytime, and is expressed as:

$$N_{VIS} = \sqrt{(V + IR_{VIS})} \quad (2)$$

In the same manner as that for $N_{VIS}$, a noise component $N_{IR}$ from a pixel for capturing infrared light is expressed as:

$$N_{IR} = \sqrt{IR_{IR}} \quad (3)$$

Specifically, if the operation as expressed by Equation (1) is performed, according to Equations (2) and (3), noise N after the operation is expressed as:

$$N = \sqrt{[\{\sqrt{(V + IR_{VIS})}\}^2 + (K\sqrt{IR_{IR}})^2]} \quad (4)$$

From Equation (4), a solid-state image sensor capable of capturing infrared light and visible light at the same time exhibits a larger amount of a noise component and a lower SN ratio after the operation in a signal after the operation than a solid-state image sensor capable of capturing only visible light. In contrast, in the solid-state image sensor of this embodiment, since an infrared light component of light incident on the second pixel 34 is partially absorbed in the projection 33 in the first pixel, the component $IR_{VIS}$ is reduced, and the component $IR_{IR}$ is increased. As a result, the noise component expressed as the first term in Equation (4) can be reduced.

In addition, only infrared light enters the portion 45 of the first photoelectric conversion region 32 located in the first pixel 31. Since infrared light incident on the first pixel 31 and the second pixel 34 is subjected to photoelectric conversion in the entire first photoelectric conversion region 32, the sensitivity to infrared light is greatly increased. Accordingly, the infrared light signal component $IR_{IR}$ from a pixel for capturing infrared light in Equation (1) is larger than that in a conventional technique, and thus a coefficient K in difference operation can be reduced. Consequently, the noise component expressed as the second term in Equation (4) can be reduced. In this example, the projection 33 of the first photoelectric conversion region 32 for capturing infrared light is provided in a pixel for capturing blue light. Alternatively, the projection 33 for receiving infrared light may be provided in a pixel receiving green light and red light. In this case, the first term in Equation (4) can also be reduced, thereby obtaining similar advantages.

Specifically, in the solid-state image sensor of this embodiment, due to the advantage of a reduction in an infrared light signal component from a pixel for capturing visible light and the advantage of an increase in an infrared light signal component from a pixel for capturing infrared light, it is possible to suppress an increase in noise in difference operation. Accordingly, when the pixel array of this embodiment is applied to a solid-state image sensor capable of capturing visible light and infrared light at the same time, it is possible to suppress a decrease in the SN ratio in difference operation, while increasing the sensitivity to infrared light.

The conductivity type of the photoelectric conversion regions in the solid-state image sensor of this embodiment may be p-type or n-type.

The color filters used in the solid-state image sensor of this embodiment may be complementary color filters containing colors such as yellow, magenta, and cyan.

Embodiment 2

Figure 6:
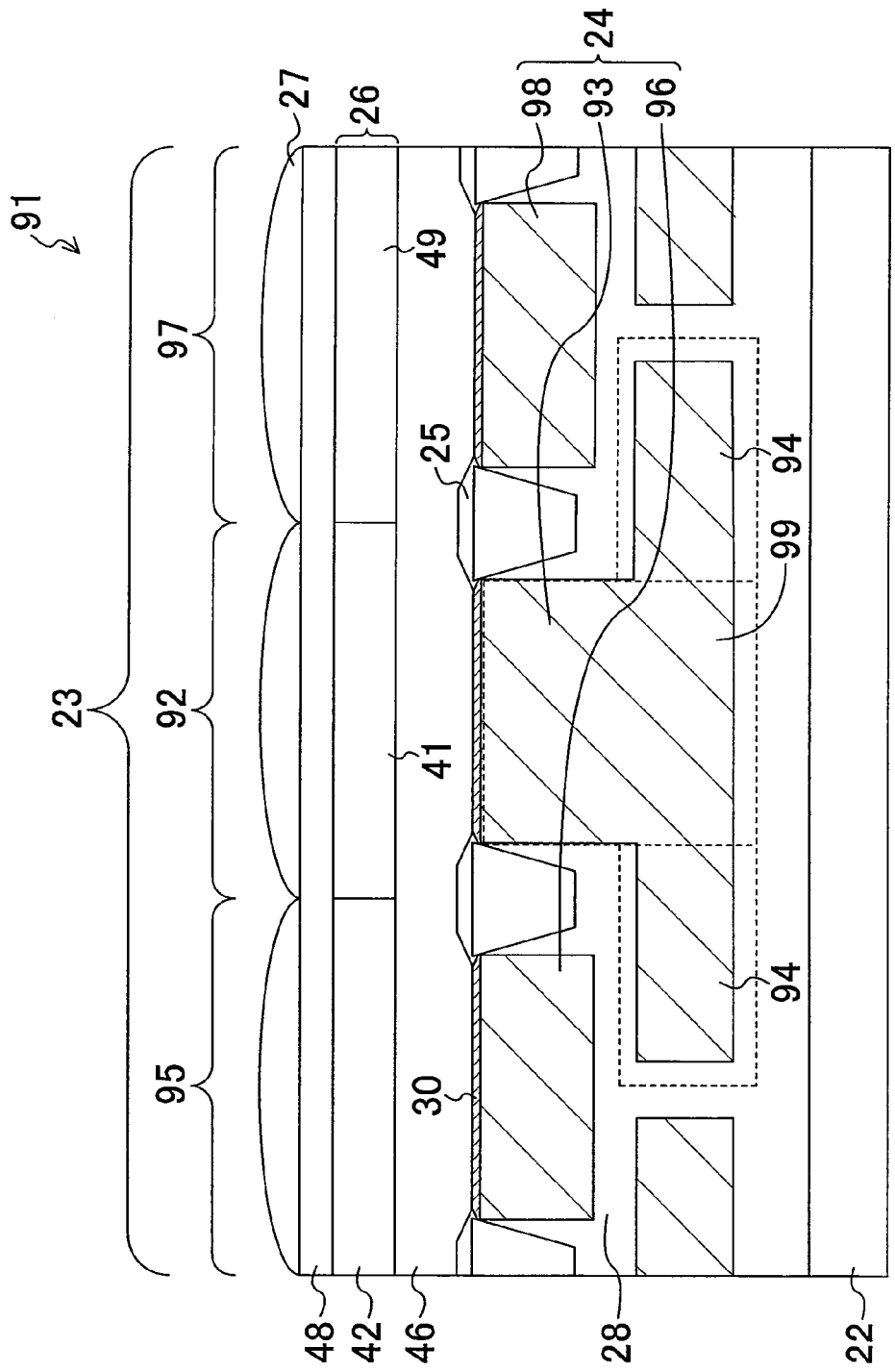
FIG. 6 is a cross-sectional view schematically illustrating a pixel section of a solid-state image sensor according to a second embodiment of the present invention.

FIG. 6 is a cross-sectional view schematically illustrating a pixel section of a solid-state image sensor according to a second embodiment of the present invention. The circuit configuration of the solid-state image sensor of this embodiment is the same as that shown in FIG. 1. The same reference numerals as those of the solid-state image sensor of the first embodiment shown FIG. 2 are used to represent equivalent elements, and the explanation thereof will be omitted.

As illustrated in FIG. 6, the solid-state image sensor 91 of this embodiment includes: a plurality of pixels 23 arranged on a semiconductor substrate 22; and an isolation region 25 provided above the semiconductor substrate 22 and electrically isolating the pixels 23 from one another.

The pixels 23 include: a semiconductor layer 28 of a first conductivity type provided on the semiconductor substrate 22; a plurality of photoelectric conversion regions 24 of a second conductivity type provided in the semiconductor layer 28; a diffusion layer 30 of the first conductivity type provided on the photoelectric conversion regions 24; a first planarized film 46 provided over the diffusion layer 30 and the isolation region 25; and a plurality of color filters 26 provided above the diffusion layer 30 (i.e., on the first planarized film 46) and associated with the respective pixels 23; a second planarized film 48 provided on the color filters 26; and a plurality of microlenses 27 provided on the second planarized film 48. The semiconductor layer 28 and each of the photoelectric conversion regions 24 form a PN junction. The diffusion layer 30 and each of the photoelectric conversion regions 24 form a PN junction.

In the example illustrated in FIG. 6, the pixels 23 include a first pixel 92, a second pixel 95, and a third pixel 97. The color filters 26 include a first color filter 41 and a second color filter 42. The photoelectric conversion regions 24 include a first photoelectric conversion region 93, a second photoelectric conversion region 96, and a third photoelectric conversion region 98. In the first pixel 92, the first photoelectric conversion region 93 and the first color filter 41 are provided. In the second pixel 95, the second photoelectric conversion region 96 and the second color filter 42 are provided. In the third pixel 97, the third photoelectric conversion region 98 and the third color filter 49 are provided. The first color filter 41 has spectral characteristics having a peak of its transmission in a first wavelength range. The second color filter 42 has spectral characteristics having a peak of its transmission in the first wavelength range and a second wavelength range including shorter wavelengths than the first wavelength range The third color filter 49 has spectral characteristics having peaks in the first wavelength range and a wavelength range (e.g., the second wavelength range) including shorter wavelengths than the first wavelength range.

In the solid-state image sensor of this embodiment, projections 94 of the first photoelectric conversion region 93 provided in the first pixel 92 extend to portions under the photoelectric conversion regions in at least two pixels adjacent to the first pixel 92. In the example illustrated in FIG. 6, in the second pixel 95 and the third pixel 97, the projections 94 extending from their adjacent pixel are located under the second photoelectric conversion region 96 and the third photoelectric conversion region 98, respectively. The first photoelectric conversion region 93, the second photoelectric conversion region 96, and the third photoelectric conversion region 98 are electrically isolated from one another by the semiconductor layer 28 of the first conductivity type. The impurity concentration in the projections 94 of the first photoelectric conversion region 93 is preferably lower than that in a portion 99 of the first photoelectric conversion region 93 located in the first pixel 92. The first photoelectric conversion region 93 is thicker, and extends to a deeper portion, than the second photoelectric conversion region 96 and the third photoelectric conversion region 98. Each of the projections 94 may extend to a portion below a signal-readout circuit in the same pixel. This configuration can increase the amount of light obliquely incident on the first pixel 92.

The projections 94 of the first photoelectric conversion region 93 may be provided in at least two pixels adjacent to the first pixel 92 and surrounding the first pixel 92.

Figure 7:
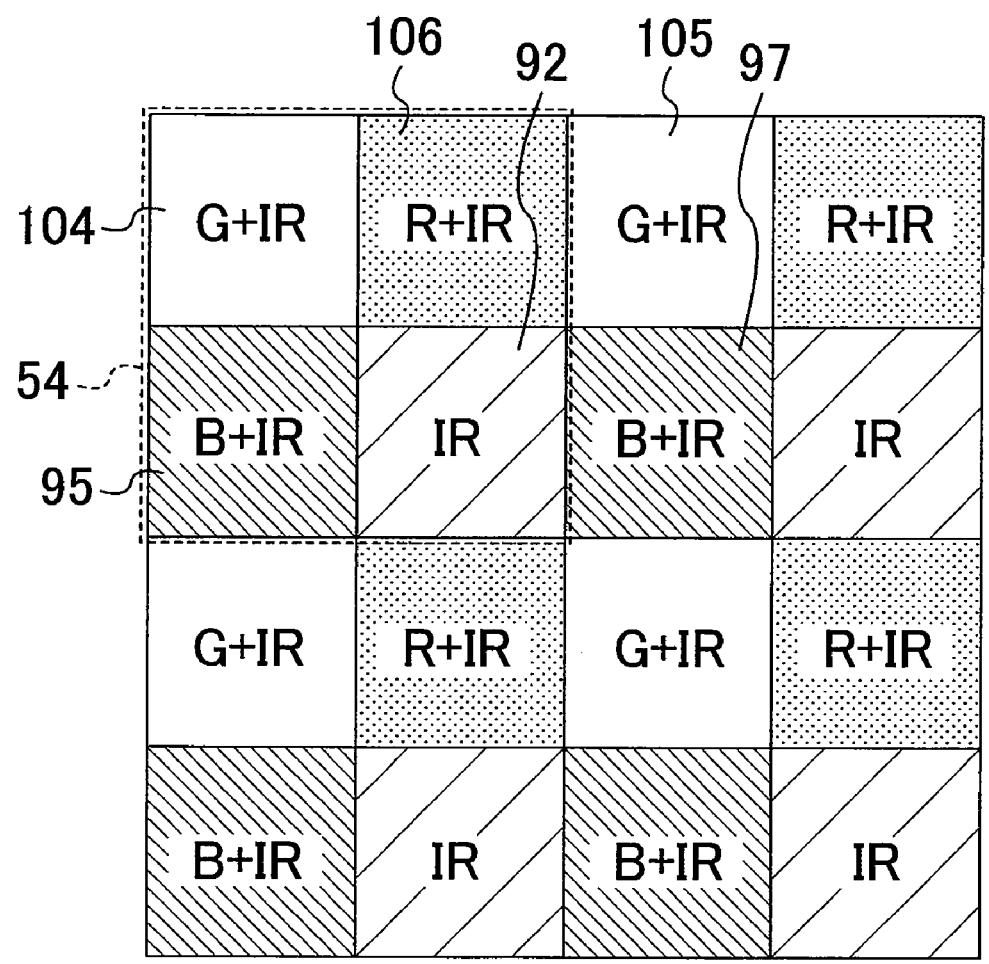
FIG. 7 is a view illustrating an example of a color filter array in the pixel section of the solid-state image sensor of the second embodiment.

FIG. 7 is a view illustrating an example of a color filter array in the pixel section of the solid-state image sensor of this embodiment. As shown in FIG. 7, in the pixel section of the solid-state image sensor of this embodiment, groups of pixels 54 each made of four pixels including at least one first pixel 92 and at least one second pixel 95 are regularly arranged in a two-dimensional array. In this example, the first pixel 92 is provided with a color filter which passes only infrared light, the second pixel 95 is provided with a color filter which passes blue light and infrared light, a pixel 104 is provided with a color filter which passes green light and infrared light, and a pixel 106 is provided with a color filter which passes red light and infrared light. The third pixel 97 is located at a side of the first pixel 92. In this example, the second pixel is the pixel 95, and the third pixel is the pixel 97. Alternatively, the second pixel and the third pixel may be arbitrarily selected as long as the selected pixels are adjacent to the first pixel 92.

In this case, only infrared light is selected from light incident on the first pixel 92 through the first color filter 41. This infrared light is subjected to photoelectric conversion in the portion 99 of the first photoelectric conversion region 93 located in the first pixel 92. The generated signal charge is accumulated in the first photoelectric conversion region 93.

In addition, blue light and infrared light are selected from light incident on the second pixel 95 through the second color filter 42. Since short-wavelength light such as blue light has a larger absorption coefficient in a semiconductor material such as silicon than long-wavelength light, the short-wavelength light is absorbed in a portion near the upper surface of the substrate (i.e., a semiconductor portion including the photoelectric conversion regions 24, the semiconductor layer 28, and the diffusion layer 30). Accordingly, the blue light is subjected to photoelectric conversion in the second photoelectric conversion region 96, and the generated signal charge is accumulated in the second photoelectric conversion region 96. On the other hand, since long-wavelength light such as infrared light reaches a deep portion of the substrate, infrared light incident on the second pixel 95 is subjected to photoelectric conversion in the second photoelectric conversion region 96 and the projections 94 of the first photoelectric conversion region 93 located under the second photoelectric conversion region 96. The generated signal charge is accumulated in the respective photoelectric conversion regions. The impurity concentration in the projections 94 of the first photoelectric conversion region 93 is preferably lower than that in the portion 99 of the first photoelectric conversion region 93 located in the first pixel 92. In this case, signal charge generated in the projections 94 is easily read out.

In the same manner as for light incident on the second pixel 95, blue light and infrared light are selected from light incident on the third pixel 97. The blue light is subjected to photoelectric conversion in the third photoelectric conversion region 98. The infrared light is subjected to photoelectric conversion in the projections 94 of the first photoelectric conversion region 93.

Green light and infrared light are selected from light incident on the pixel 104 through the color filters 26. The selected light is subjected to photoelectric conversion in the photoelectric conversion region in this pixel. The generated signal charge is accumulated in the photoelectric conversion region. Further, red light and infrared light are selected from light incident on the pixel 106. The selected light is subjected to photoelectric conversion in the photoelectric conversion region in the pixel 106. The generated signal charge is accumulated in the photoelectric conversion region.

In the solid-state image sensor of this embodiment, the projections 94 of the first photoelectric conversion region 93 extend to portions under the photoelectric conversion regions in two or more pixels adjacent to the first pixel 92 for receiving long-wavelength light. Accordingly, the first photoelectric conversion region 93 can perform photoelectric conversion on long-wavelength components of light incident on the adjacent pixels, thereby further increasing the sensitivity to long-wavelength light, as compared to the example illustrated in FIG. 2. In addition, since the projections 94 of the first photoelectric conversion region 93 extend to portions under the photoelectric conversion regions in two or more pixels adjacent to the first pixel 92, even when the region extending in one adjacent pixel is shorter than that in the first embodiment, high sensitivity is expected. Accordingly, charge can be more easily read out from the projections 94. Further, in the same manner as in the solid-state image sensor of the first embodiment, when the solid-state image sensor is configured to capture visible light and infrared light at the same time, it is possible to suppress a decrease in the SN ratio in difference operation.

In the color filters of the example illustrated in FIG. 7, infrared light is used as light in the first wavelength range and blue light is used as light in the second wavelength range. However, the second wavelength range only needs to include shorter wavelengths than the first wavelength range. Specifically, if the first wavelength range is an infrared region, the second wavelength range may be a blue region, a green region, or a red region, for example. If the first wavelength range is a red region, the second wavelength range may be a blue region or a green region, for example.

Embodiment 3

Figure 8:
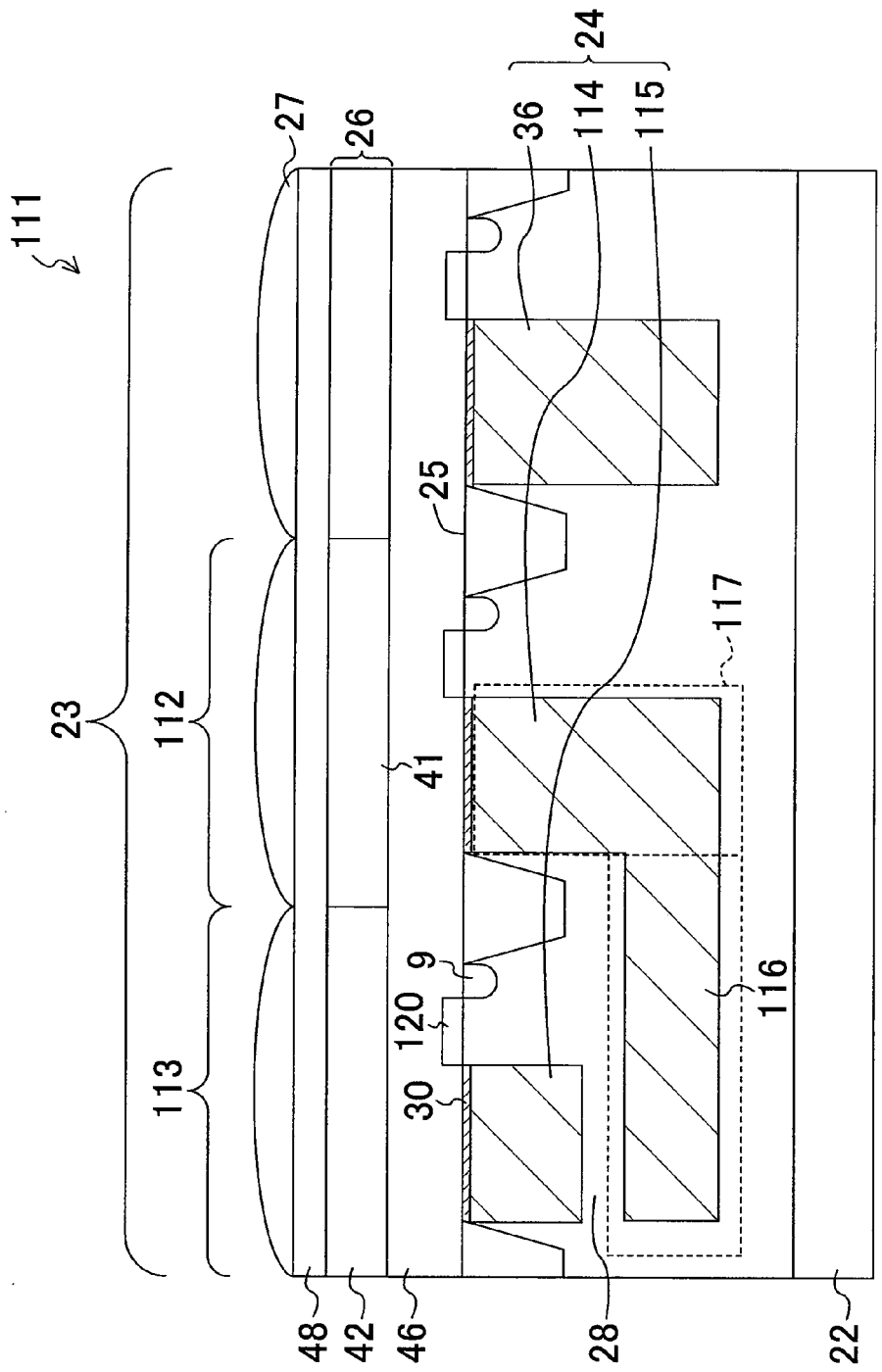
FIG. 8 is a cross-sectional view schematically illustrating a pixel section of a solid-state image sensor according to a third embodiment of the present invention.

FIG. 8 is a view schematically illustrating a pixel section of a solid-state image sensor as a MOS image sensor according to a third embodiment of the present invention in a cross section taken along a line different from that in FIG. 2. The circuit configuration of the solid-state image sensor of this embodiment is the same as that shown in FIG. 1. The same reference numerals as those of the solid-state image sensor of the first embodiment shown FIG. 2 are used to represent equivalent elements, and the explanation thereof will be omitted.

As illustrated in FIG. 8, the solid-state image sensor 111 of this embodiment includes: a plurality of pixels 23 arranged on a semiconductor substrate 22; and an isolation region 25 provided above the semiconductor substrate 22 and electrically isolating the pixels 23 from one another.

FIG. 8 shows only part of a signal-readout circuit 19 (see FIG. 1), and more specifically shows floating diffusions 9 for reading charge accumulated in photoelectric conversion regions 24, and transfer gates 120 of transfer transistors 2 for transferring charge accumulated in the photoelectric conversion regions 24 to the floating diffusions 9.

The pixels 23 include: a semiconductor layer 28 of a first conductivity type provided on the semiconductor substrate 22; a plurality of photoelectric conversion regions 24 of a second conductivity type provided in the semiconductor layer 28; a diffusion layer 30 of the first conductivity type provided on the photoelectric conversion regions 24; a first planarized film 46 provided over the diffusion layer 30 and the isolation region 25; and a plurality of color filters 26 provided above the diffusion layer 30 (i.e., on the first planarized film 46) and associated with the respective pixels 23; a second planarized film 48 provided on the color filters 26; and a plurality of microlenses 27 provided on the second planarized film 48. The semiconductor layer 28 and each of the photoelectric conversion regions 24 form a PN junction. The diffusion layer 30 and each of the photoelectric conversion regions 24 form a PN junction.

In the example illustrated in FIG. 8, the pixels 23 include a first pixel 112, and a second pixel 113 adjacent to the first pixel 112. The color filters 26 include a first color filter 41 and a second color filter 42. The photoelectric conversion regions 24 include a first photoelectric conversion region 114 and a second photoelectric conversion region 115.

In the first pixel 112, the first photoelectric conversion region 114 and the first color filter 41 are provided. In the second pixel 113, the second photoelectric conversion region 115 and the second color filter 42 are provided. The first color filter 41 has spectral characteristics having a peak of its transmission in a first wavelength range. The second color filter 42 has spectral characteristics having peaks of its transmission in the first wavelength range and a second wavelength range including shorter wavelengths than the first wavelength range The third color filter 49 has spectral characteristics having peaks in the first wavelength range and a wavelength range (e.g., the second wavelength range) including shorter wavelengths than the first wavelength range.

In the solid-state image sensor of this embodiment, a projection 116 of the first photoelectric conversion region 114 located in the first pixel 112 extends to a portion under the photoelectric conversion region and a readout circuit in at least one adjacent pixel. In this case, as illustrated in FIG. 8, the projection 116 of the first photoelectric conversion region 114 extends across a portion under the floating diffusion 9 and the transfer gate 120 to reach a portion under the second photoelectric conversion region 115. The first photoelectric conversion region 114 and the second photoelectric conversion region 115 are electrically isolated from each other by the semiconductor layer 28 of the first conductivity type. The impurity concentration in the projection 116 of the first photoelectric conversion region 114 is preferably lower than that in a portion 117 of the first photoelectric conversion region 114 located in the first pixel 112. The first photoelectric conversion region 114 is thicker, and extends to a deeper portion, than the second photoelectric conversion region 115.

The projection 116 of the first photoelectric conversion region 114 only needs to be provided in at least one pixel adjacent to the first pixel 112 and surrounding the first pixel 112.

In this example, it is preferable that the projection 116 of the first photoelectric conversion region 114 extends across a portion under the floating diffusion 9 and the transfer transistor 2 to reach a portion under the second photoelectric conversion region 115, and is not located in portions under in-pixel circuits (i.e., a select transistor 8, a reset transistor 4, and an amplifying transistor 6). The select transistor 8, the reset transistor 4, and the amplifying transistor 6 are formed in a semiconductor layer (i.e., a well). If the first photoelectric conversion region 114 extended to portions under the select transistor 8, the reset transistor 4, and the amplifying transistor 6, charge generated in the first photoelectric conversion region 114 by incident light would cause the potential at the semiconductor layer (i.e., the well) to be unstable, thereby causing noise during read operation. The first photoelectric conversion region 114 does not need to include portions under the in-pixel circuits such as the floating diffusion 9, the transfer gate 120, and the select transistor 8, and may extend across a portion located only under the isolation region 25 to reach a portion in the second pixel 113.

In this case, light in the first wavelength range is selected from light incident on the first pixel 112 through the first color filter 41. This selected light is subjected to photoelectric conversion in the portion 117 of the first photoelectric conversion region 114 located in the first pixel 112. The generated signal charge is accumulated in the first photoelectric conversion region 114.

Light in the first wavelength range and light in the second wavelength range are selected from light incident on the second pixel 113 through the second color filter 42. Since light in the second wavelength range has a wavelength shorter than that in the first wavelength range, and has a relatively large absorption coefficient with respect to a semiconductor material such as silicon, the light in the second wavelength range is absorbed in a portion near the upper surface of the substrate (i.e., a semiconductor portion including the photoelectric conversion regions 24, the semiconductor layer 28, and the diffusion layer 30). Accordingly, the light in the second wavelength range is subjected to photoelectric conversion in the second photoelectric conversion region 115, and the generated signal charge is accumulated in the second photoelectric conversion region 115. On the other hand, since light in the first long-wavelength range reaches a deep portion of the substrate, light in the first wavelength range incident on the second pixel 113 is subjected to photoelectric conversion in the second photoelectric conversion region 115 and the projection 117 of the first photoelectric conversion region 114 located under the second photoelectric conversion region 115. The generated signal charge is accumulated in the photoelectric conversion regions. The impurity concentration in the projection 117 of the first photoelectric conversion region 114 is preferably lower than that in the portion 117 of the first photoelectric conversion region 114 located in the first pixel 112. In this case, signal charge generated in the portion 117 is easily read out.

In the solid-state image sensor of this embodiment, the projection 116 of the first photoelectric conversion region 114 extends to portions under the photoelectric conversion regions in a plurality of pixels adjacent to the first pixel 112 for receiving long-wavelength light, the floating diffusion 9, the transfer gate 120, and the isolation region 25. Accordingly, the light-receiving area of the first photoelectric conversion region 114 can be further increased and the sensitivity to long-wavelength light can be further increased, as compared with the example illustrated in FIG. 2. In addition, in the same manner as in the solid-state image sensor of the first embodiment, if the solid-state image sensor is configured to capture visible light and infrared light at the same time, it is possible to suppress a decrease in the SN ratio occurring in difference operation.

The present invention is not limited to the foregoing embodiments, and various modifications and changes can be made to components without departing from the scope of the present invention.

INDUSTRIAL APPLICABILITY

Solid-state image sensors according to the embodiments of the present invention are applicable to video cameras, digital cameras, and cameras for use in vehicle onboard systems and security systems, which are capable of capturing long-wavelength light such as red light and infrared light.

DESCRIPTION OF REFERENCE CHARACTERS 2 transfer transistor
4 reset transistor
6 amplifying transistor
8 select transistor
9 floating diffusion
11 pixel section
12 peripheral circuit
13, 63, 64, 83, 85 pixel
14 horizontal shift register
15 vertical shift register
16 CDS circuit
17 amplifier
18 photoelectric conversion region
19 signal-readout circuit
21, 91, 111 solid-state image sensor
22 semiconductor substrate
23 pixels
24 photoelectric conversion regions
25 isolation region
26 color filters
27 microlens
28 semiconductor layer
29 signal line
30 diffusion layer
31, 92, 112 first pixel
32, 93, 114 first photoelectric conversion region
33, 94, 116 projection
34, 95, 113 second pixel
35, 96, 115 second photoelectric conversion region
36, 98 third photoelectric conversion region
41 first color filter
42 second color filter
45, 99, 117 portion of first photoelectric conversion region located in first pixel
46 first planarized film
48 second planarized film
49 third color filter
51, 53, 54 a group of pixels
71, 72, 73, 74 color filter
97 third pixel
104, 105, 106 pixel The invernction claimed is:

1. A solid-state image sensor, comprising:
a semiconductor substrate;
a plurality of pixels arranged on the semiconductor substrate and respectively including photoelectric conversion regions: and
an isolation region electrically isolating the pixels from one another, wherein
a first pixel of the pixels includes a first photoelectric conversion region and a first color filter having a peak of its optical transmission in a first wavelength range,
a second pixel of the pixels adjacent to the first pixel includes a second photoelectric conversion region and a second color filter having peaks in its optical transmission in the first wavelength range and a second wavelength range including shorter wavelengths than the first wavelength range,
a deep portion of the first photoelectric conversion region partially extends across the isolation region to reach a portion under the second photoelectric conversion region, and
a portion of the first photoelectric conversion region included in the second pixel has an impurity concentration lower than that in a portion of the first photoelectric conversion region included in the first pixel.

2. The solid-state image sensor of claim 1, wherein the first photoelectric conversion region performs photoelectric conversion on light in the first wavelength range, and
the second photoelectric conversion region performs photoelectric conversion on light in the first wavelength range and light in the second wavelength range.

3. The solid-state image sensor of claim 2, wherein the light in the first wavelength range is invisible light, and
the light in the second wavelength range is visible light.

4. The solid-state image sensor of claim 1, wherein the pixels further include a signal-readout circuit configured to read signals subjected to photoelectric conversion in the respective photoelectric conversion regions, and
a deep portion of the first photoelectric conversion region partially extends under the signal-readout circuit.

5. A solid-state image sensor, comprising:
a semiconductor substrate;
a plurality of pixels arranged on the semiconductor substrate and respectively including photoelectric conversion regions;
an isolation region electrically isolating the pixels from one another; and
a semiconductor layer of a conductivity type opposite to a conductivity type of the first and second photoelectric conversion regions, wherein
a first pixel of the pixels includes a first photoelectric conversion region and a first color filter having a peak of its optical transmission in a first wavelength range,
a second pixel of the pixels adjacent to the first pixel includes a second photoelectric conversion region and a second color filter having peaks in its optical transmission in the first wavelength range and a second wavelength range including shorter wavelengths than the first wavelength range,
a deep portion of the first photoelectric conversion region partially extends across the isolation region to reach a portion under the second photoelectric conversion region, and
the semiconductor layer is provided in the second pixel, and electrically isolates part of the deep portion of the first photoelectric conversion region and the second photoelectric conversion region from each other.

6. The solid-state image sensor of claim 5, wherein the first photoelectric conversion region performs photoelectric conversion on light in the first wavelength range, and
the second photoelectric conversion region performs photoelectric conversion on light in the first wavelength range and light in the second wavelength range.

7. The solid-state image sensor of claim 6, wherein the light in the first wavelength range is invisible light, and
the light in the second wavelength range is visible light.

8. The solid-state image sensor of claim 5, wherein the pixels further include a signal-readout circuit configured to read signals subjected to photoelectric conversion in the respective photoelectric conversion regions, and
a deep portion of the first photoelectric conversion region partially extends under the signal-readout circuit.

* * * * *